(12) United States Patent
Rueger et al.

(10) Patent No.: US 7,632,737 B2
(45) Date of Patent: Dec. 15, 2009

(54) PROTECTION IN INTEGRATED CIRCUITS

(75) Inventors: Neal R. Rueger, Boise, ID (US); William Budge, Homedale, ID (US); Weimin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 11/458,064

(22) Filed: Jul. 17, 2006

(65) Prior Publication Data

US 2006/0270240 A1 Nov. 30, 2006

Related U.S. Application Data

(62) Division of application No. 10/231,388, filed on Aug. 29, 2002, now Pat. No. 7,494,894.

(51) Int. Cl.
*H01L 21/762* (2006.01)

(52) U.S. Cl. ................. 438/435; 438/437; 257/E21.546

(58) Field of Classification Search ............. 438/435, 438/437; 257/E21.546
See application file for complete search history.

(56) References Cited

U.S. PATENT DOCUMENTS

| | | | |
|---|---|---|---|
| 5,956,612 A | 9/1999 | Elliott et al. |
| 6,033,970 A | 3/2000 | Park |
| 6,037,018 A | 3/2000 | Jang et al. |
| 6,093,618 A | 7/2000 | Chen et al. |
| 6,121,134 A | 9/2000 | Burton et al. |
| 6,146,974 A | 11/2000 | Liu et al. |
| 6,174,785 B1 | 1/2001 | Parekh et al. |
| 6,200,911 B1 | 3/2001 | Narwankar et al. |
| 6,204,171 B1 | 3/2001 | Hu |
| 6,204,172 B1 | 3/2001 | Marsh |
| 6,218,288 B1 | 4/2001 | Li et al. |
| 6,251,748 B1 | 6/2001 | Tsai |
| 6,255,194 B1 | 7/2001 | Hong |
| 6,265,282 B1 | 7/2001 | Lane et al. |
| 6,281,072 B1 | 8/2001 | Li et al. |
| 6,297,128 B1 | 10/2001 | Kim et al. |
| 6,309,975 B1 | 10/2001 | Wu et al. |
| 6,316,360 B1 | 11/2001 | Burton et al. |
| 6,320,261 B1 | 11/2001 | Burton et al. |
| 6,323,081 B1 | 11/2001 | Marsh |
| 6,326,282 B1 | 12/2001 | Park et al. |
| 6,414,364 B2 | 7/2002 | Lane et al. |
| 6,461,967 B2 | 10/2002 | Wu et al. |
| 6,489,199 B2 | 12/2002 | Li et al. |

(Continued)

OTHER PUBLICATIONS

U.S. Appl. No. 10/231,388, Non Final Office Action mailed Oct. 9, 2003, 6 pgs.

(Continued)

*Primary Examiner*—George Fourson
(74) *Attorney, Agent, or Firm*—Schwegman, Lundberg & Woessner, P.A.

(57) ABSTRACT

A method including, prior to a plasma heat-up operation, forming a liner on structure coated with an insulator. And a method including forming a trench on a substrate, forming an insulator on the trench, and after forming a liner having a thickness of between about 50 angstroms and about 400 angstroms on the insulator, applying a plasma heat-up operation to the substrate.

37 Claims, 4 Drawing Sheets

U.S. PATENT DOCUMENTS

| | | | |
|---|---|---|---|
| 6,495,921 | B1 | 12/2002 | Burton et al. |
| 6,544,871 | B1 | 4/2003 | Honeycutt |
| 6,596,642 | B2 | 7/2003 | Ma et al. |
| 6,596,648 | B2 | 7/2003 | Wu et al. |
| 6,599,840 | B2 | 7/2003 | Wu et al. |
| 6,617,689 | B1 | 9/2003 | Honeycutt |
| 6,690,094 | B2 | 2/2004 | Burton et al. |
| 6,713,350 | B2 | 3/2004 | Rudeck |
| 6,720,638 | B2 | 4/2004 | Tran |
| 6,724,089 | B2 | 4/2004 | Trivedi et al. |
| 7,494,894 | B2 | 2/2009 | Rueger et al. |
| 2001/0039092 | A1 | 11/2001 | Morimoto et al. |
| 2002/0008270 | A1 | 1/2002 | Marsh |
| 2002/0045325 | A1 | 4/2002 | Kuhn et al. |
| 2002/0064970 | A1 | 5/2002 | Chooi et al. |
| 2002/0076900 | A1 | 6/2002 | Park et al. |
| 2002/0109233 | A1 | 8/2002 | Farrar |
| 2002/0109235 | A1 | 8/2002 | Leiphart |
| 2002/0142550 | A1 | 10/2002 | Kumamoto |
| 2004/0070916 | A1 | 4/2004 | Tsuruta et al. |

OTHER PUBLICATIONS

U.S. Appl. No. 10/231,388, Response filed Jan. 9, 2004 to Non Final Office Action mailed Oct. 9, 2003, 16 pgs.

U.S. Appl. No. 10/231,388, Final Office Action mailed Apr. 21, 2004, 5 pgs.

U.S. Appl. No. 10/231,388, Response filed Jul. 15, 2004 to Final Office Action mailed Apr. 21, 2004, 6 pgs.

U.S. Appl. No. 10/231,388, Non Final Office Action mailed Oct. 6, 2004, 5 pgs.

U.S. Appl. No. 10/231,388, Response filed Mar. 25, 2005 to Non Final Office Action mailed Oct. 6, 2004, 15 pgs.

U.S. Appl. No. 10/231,388, Non Final Office Action mailed Jun. 8, 2005, 5 pgs.

U.S. Appl. No. 10/231,388, Response filed Sep. 8, 2005 to Non Final Office Action mailed Jun. 8, 2005, 16 pgs.

U.S. Appl. No. 10/231,388, Final Office Action mailed Nov. 28, 2005, 7 pgs.

U.S. Appl. No. 10/231,388, Response filed Jan. 30, 2006 to Final Office Action mailed Nov. 28, 2005, 10 pgs.

U.S. Appl. No. 10/231,388, Advisory Action mailed Mar. 15, 2006, 2 pgs.

U.S. Appl. No. 10/231,388, Response filed Mar. 28, 2006 to Advisory Action mailed Mar. 15, 2006, 3 pgs.

U.S. Appl. No. 10/231,388, Notice of Non-Compliant Amendment mailed Jun. 14, 2006, 3 pgs.

U.S. Appl. No. 10/231,388, Response filed Jul. 13, 2006 to Notice of Non-Compliant Amendment mailed Jun. 14, 2006, 6 pgs.

U.S. Appl. No. 10/231,388, Non Final Office Action mailed Oct. 11, 2006, 7 pgs.

U.S. Appl. No. 10/231,388, Response filed Dec. 11, 2006 to Non Final Office Action mailed Oct. 11, 2006, 9 pgs.

U.S. Appl. No. 10/231,388, Final Office Action mailed Mar. 2, 2007, 6 pgs.

U.S. Appl. No. 10/231,388, Response filed Apr. 12, 2007 to Final Office Action mailed Mar. 2, 2007, 11 pgs.

U.S. Appl. No. 10/231,388, Advisory Action mailed Apr. 30, 2007, 3 pgs.

U.S. Appl. No. 10/231,388, Response filed May 30, 2007 to the Final Office Action mailed Mar. 2, 2007 and the Advisory Action mailed Apr. 30, 2007, 12 pgs.

U.S. Appl. No. 10/231,388, Non Final Office Action mailed Aug. 8, 2007, 6 pgs.

Non-Final Office Action mailed Aug. 8, 2007 in U.S. Appl. No. 10/231,388, 6.

U.S. Appl. No. 10/231,388 Response filed Nov. 1, 2007 to Non-Final Office Action mailed Aug. 8, 2007, 10 pgs.

U.S. Appl. No. 10/231,388, Response filed Nov. 1, 2007 to Non Final Office Action mailed Aug. 8, 2007, 10 pgs.

U.S. Appl. No. 10/231,388, Final Office Action mailed Feb. 8, 2008, 4 pgs.

PROTECTION IN INTEGRATED CIRCUITS

RELATED APPLICATIONS

This application is a Divisional of U.S. application Ser. No. 10/231,388, filed Aug. 29, 2002, now U.S. Pat. No. 7,494,894, which is incorporated herein by reference.

FIELD OF THE INVENTION

The present invention relates to integrated circuits, and more particularly, to manufacturing integrated circuits.

BACKGROUND OF THE INVENTION

Integrated circuits include devices, such as transistors, and structures, such as trenches. These devices and structures are manufactured using processes, such as annealing, chemical vapor deposition and plasma vapor deposition, that control physical parameters such as temperature and pressure in a processing environment. Products manufactured using these processes often contain defects that can be difficult to detect. The difficultly comes from the fact that the failure rate for a particular device or structure may be within the expected failure rate for the devices or structures manufactured using these processes, despite the fact that a new failure mechanism is causing new defects.

Even after identifying new defects in a device or structure, applying models of the manufacturing processes for integrated circuit devices and structures often does not provide sufficient information to connect the device and structure failures or defects to a particular process. Thus, precisely identifying a failing process and how the failing process contributes to a device or structure defect is a difficult problem. Attacking and solving this type of problem is part of the inventive process in the integrated circuit manufacturing art. One method of attacking this problem includes using a scanning electron microscope (SEM) to identify defects in an integrated circuit. The examination of a photomicrograph produced using an SEM can yield visual information that is often helpful in identifying a defective or failed process. However, even after identifying defects and sources of the defects, new or modified methods and manufactures must be devised to produce defect free devices and structures. For these and other reasons there is a need for the present invention.

DETAILED DESCRIPTION

In the following detailed description of the described embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
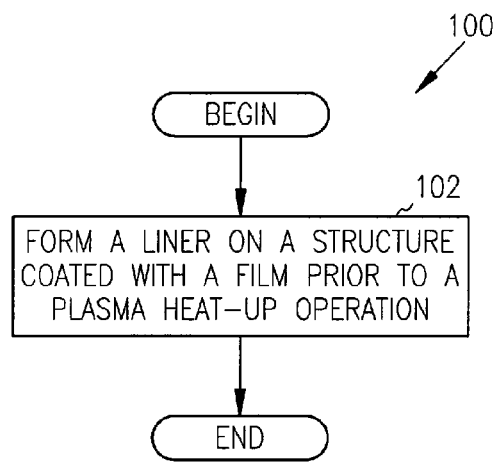
FIG. 1 shows a flow diagram for a method including forming a liner on a structure coated with a film, prior to a plasma heat-up operation in accordance with one embodiment of the invention.

FIG. 1 shows a flow diagram for a method 100 including forming a liner on a structure coated with a film prior to a plasma heat-up operation 102 in accordance with one embodiment of the invention. The plasma heat-up operation increases the temperature of the structure and the film in order to prepare the structure and the film to receive a fill material. If the structure and the film are not heated prior to formation of the fill material, voids and other defects may be included in the fill material. Applicants have discovered through the use of a scanning electron microscope that when the liner is not formed on the film, the film is eroded during the plasma heat-up operation. Erosion of the film degrades or destroys the operation of the film. Therefore, the liner, which is described in more detail below, is formed on the film prior to the plasma heat-up operation in order to prevent erosion of the film during the plasma heat-up operation.

Figure 2A:
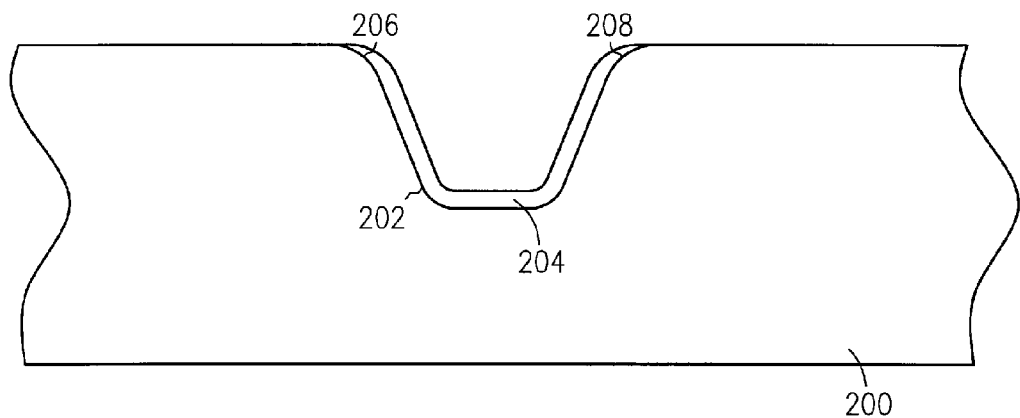
FIG. 2A shows a cross-sectional view of a substrate including a structure and a film prior to a plasma heat-up operation.

FIG. 2A shows a cross-sectional view of a substrate 200 including a structure 202 and a film 204 prior to a plasma heat-up operation. The substrate 200 provides a base for the fabrication of the structure 202. The substrate 200 is not limited to being fabricated from a particular type of material. Types of materials suitable for use in connection with the fabrication of the substrate 200 include insulators, semiconductors and conductors. Exemplary insulators suitable for use in connection with the fabrication of the substrate 200 include glass, amorphous silicon and silicon dioxide. Exemplary semiconductors suitable for use in connection with the fabrication of the substrate 200 include silicon, germanium, silicon-germanium, gallium arsenide, zinc selenide and silicon-on-sapphire. Exemplary conductors suitable for use in connection with the fabrication of the substrate 200 include gold alloys, silver alloys and copper alloys. The substrate 200 is also not limited to being fabricated from a single material. For example, structural combinations of materials can be used in connection with the fabrication of the substrate 200. Structural combinations suitable for use in connection with the fabrication of the substrate 200 include laminates and coated laminates. A laminate includes a plurality of stacked layers of one or more materials. Exemplary materials suitable for use in connection with the fabrication of laminates include insulators, semiconductors and conductors. Exemplary materials suitable for use in connection with the fabrication of coated laminates include silicon-on-sapphire coated with silicon dioxide.

The structure 202 is formed on the substrate 200. The structure 202 is not limited to a particular type of structure. The structure 202 includes any type of depression structure, coated depression structure, build-up structure or coated build-up structure formed within or on the substrate 200. Exemplary depression structures include cavities, holes or low areas on the surface of a substrate. A depression structure is not limited to a particular shape. Exemplary depression structure shapes include trenches having substantially vertical sides and a substantially flat bottom, v-shaped trenches and semi-circular shaped trenches. A coated depression structure includes a depression structure formed within or on the substrate 200 and coated with one or more materials. Exemplary types of materials suitable for use in connection with coating a depression structure include insulators and semiconductors. A build-up structure includes a laminate formed and shaped within or on the substrate 200. Exemplary types of materials suitable for use in connection with a laminate that forms a build-up structure include insulators, semiconductors and conductors. A coated build-up structure includes depression structures formed within or on the substrate 200 and coated with one or more materials. Exemplary types of materials suitable for use in coating a depression structure include insulators and semiconductors. Exemplary insulators suitable for use in connection with the fabrication of the structure 202 include silicon dioxide. Exemplary semiconductors suitable for use in connection with the fabrication of the structure 202 include silicon, germanium, gallium arsenide, silicon-germanium and zinc selenide. Exemplary conductors suitable for use in connection with a build up-structure include gold alloys, silver alloys and copper alloys.

The film 204, which is formed on the structure 202, is not limited to being formed from a particular type of material. Exemplary types of materials suitable for use in connection with the formation of the film 204 include insulators and semiconductors. Laminates of insulators, laminates of semiconductors and laminates of insulators and semiconductors are also suitable for use in connection with the formation of the film 204. Exemplary insulators suitable for use in connection with the formation of the film 204 include oxides, such as silicon dioxide, and nitrides, such as silicon nitride. Laminates of oxides and nitrides, such as silicon nitride formed on silicon dioxide, are also suitable for use in connection with the formation of the film 204. Exemplary semiconductors suitable for use in connection with the formation of the film 204 include silicon, germanium, gallium arsenide and zinc selenide. The film 204 can be formed from a single layer of atoms. A single layer of atoms is sometimes referred to as a mono-layer.

The film 204 is also not limited to being formed using a particular process. Any process capable of forming films is suitable for use in connection with the formation of the film 204. For example, sputtering processes, chemical vapor deposition processes and plasma vapor deposition processes are all suitable for use in connection with the formation of the film 204. In addition, combinations of sputtering processes, chemical vapor deposition processes and plasma vapor deposition processes are also suitable for use in connection with the formation of the film 204.

The structure 202 and the film 204 can erode during a plasma heat-up operation. This erosion may result from the accumulation of charge at edges 206 and 208 of the structure 202. This local accumulation of charge at the edges 206 and 208 causes ions from the plasma formed during the heat-up operation to bombard the edges 206 and 208. This bombardment causes the erosion of the structure 202 and the film 204.

Figure 2B:
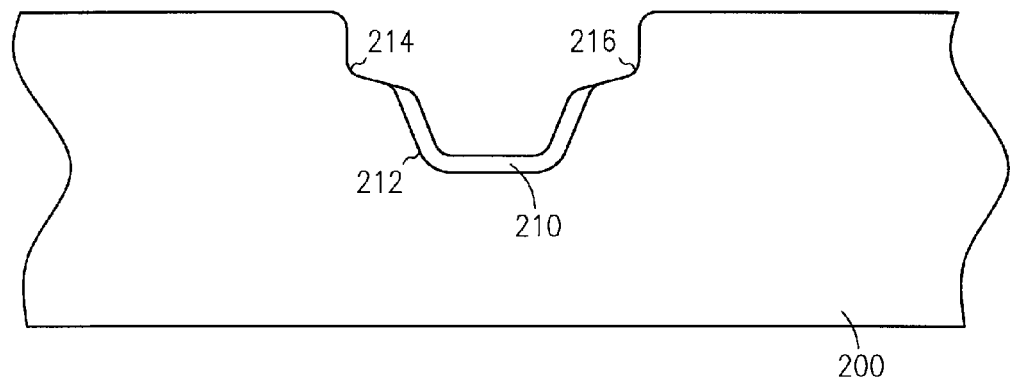
FIG. 2B shows the substrate, which is shown in FIG. 2A, including an eroded film, which is the portion of the film shown in FIG. 2A that remains after a plasma heat-up operation, and an eroded structure including eroded edges.

FIG. 2B shows the substrate 200, which is shown in FIG. 2A, including an eroded film 210, which is the portion of the film 204 shown in FIG. 2A that remains after a plasma heat-up operation, and an eroded structure 212 including eroded edges 214 and 216. The eroded film 210 remains after erosion of the film 204 (shown in FIG. 2A), however the eroded film 210 may be unable to perform the intended function of the film 204. For example, if the purpose of the film 204 is to function as a diffusion barrier, then the erosion of a portion of the film 204 destroys the ability of the film 204 to function as a diffusion barrier.

Figure 2C:
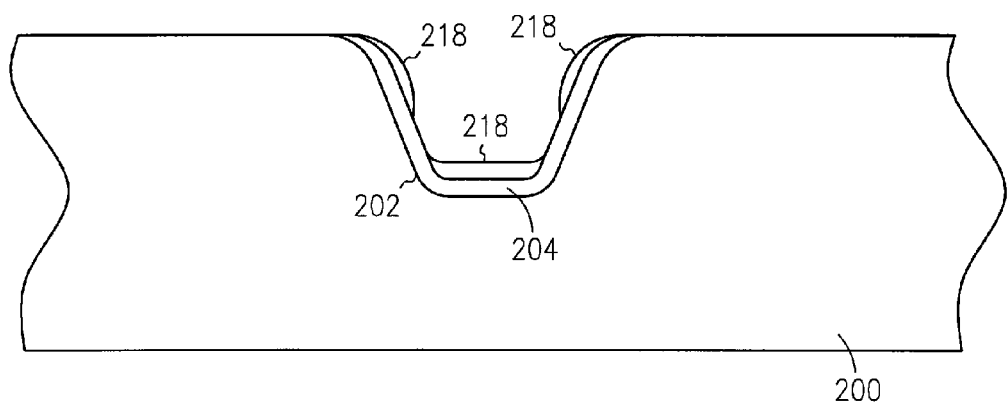
FIG. 2C shows the substrate, which is shown in FIG. 2A, including the structure and the film, which are shown in FIG. 2A, and a liner formed on the film in accordance with one embodiment of the invention.

FIG. 2C shows the substrate 200, which is shown in FIG. 2A, including the structure 202 and the film 204, which are shown in FIG. 2A, and a liner 218 formed on the film 204 in accordance with one embodiment of the invention. The liner 218 protects the film 204 from erosion during heat-up. Although the liner 218 is shown as three disconnected liner elements in FIG. 2C, the liner 218 is not limited to being formed as three disconnected liner elements. The liner 218 may be formed as two or more discontinuous liner elements or as one continuous liner element. The liner 218 is not limited to being fabricated from a particular material. In one embodiment, the liner 218 includes a thin film insulator. In an alternative embodiment, the liner 218 includes an oxide. In another alternative embodiment, the liner includes a liner having a thicknesses of between about 50 angstroms and about 400 angstroms. A liner having a thickness of less than 50 angstroms is insufficient to prevent erosion during heat-up. A liner having a thickness of more than about 400 angstroms interferes with the filling of the structure 202 with a fill material. In another alternative embodiment, the liner 218 includes a thin film insulator partially covering the film 204. In another alternative embodiment, the liner 218 includes an oxide completely covering the film 204.

Figure 2D:
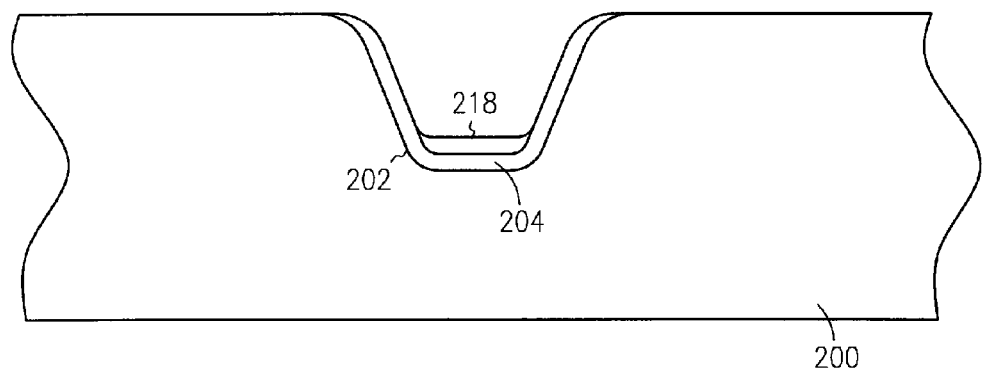
FIG. 2D shows the substrate, which is shown in FIG. 2C, and the structure including the film and the liner only partially eroded after the plasma heat-up operation in accordance with another embodiment of the invention.

FIG. 2D shows the substrate 200, which is shown in FIG. 2C, and the structure 202 including the film 204 and the liner 218 only partially eroded after the plasma heat-up operation in accordance with another embodiment of the invention. The film 204 is substantially unchanged after the plasma heat-up operation. Thus, the liner 218 protects the film 204 from erosion during a plasma heat-up operation.

Figure 2E:
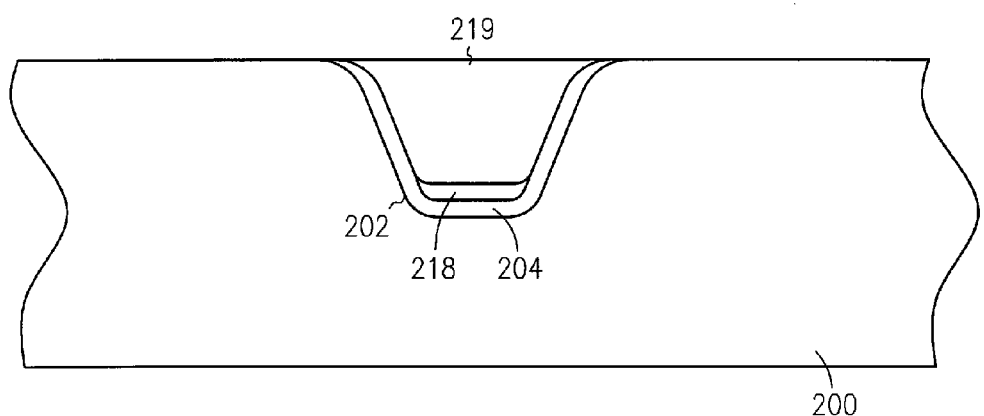
FIG. 2E shows the substrate, which is shown in FIG. 2D, and the structure including the film and the liner, and a fill material formed in the structure.

FIG. 2E shows the substrate 200, which is shown in FIG. 2D, and the structure 202 including the film 204 and the liner 218, and a fill material 219 formed in the structure 202. The fill material 219 fills the structure 202 and is substantially free of voids and defects. The fill material 219 is not limited to being formed from a particular class of materials. Exemplary classes of materials suitable for use in connection with the fill material 219 include insulators, semiconductors and conductors. Any integrated circuit manufacturing process suitable for use in forming insulators, semiconductors and conductors is suitable for use in connection with the formation of the fill material 219. In some processes the liner 218 is absorbed into the fill material 219. In other processes the liner 218 is absorbed into the film 204.

Figure 2F:
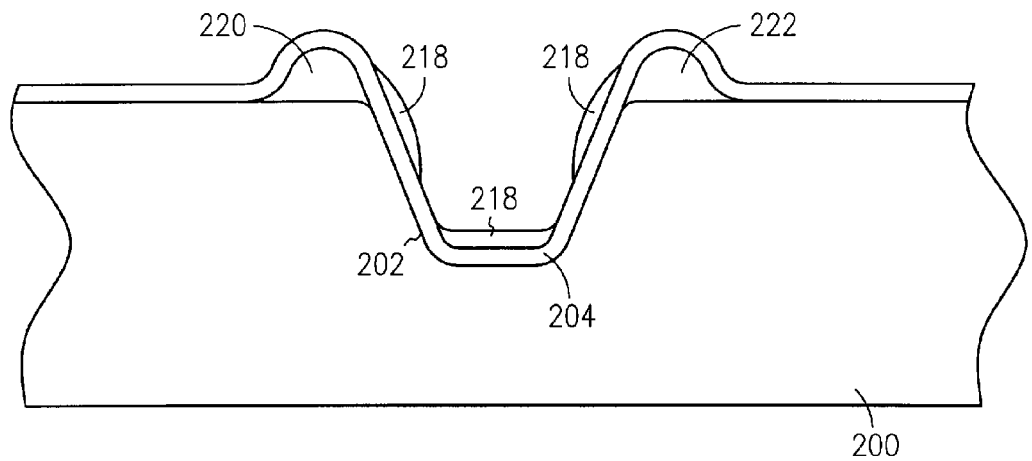
FIG. 2F shows the substrate, which is shown in FIG. 2A, including the structure and the film, which are shown in FIG. 2A, and caps and a liner formed on the film in accordance with another embodiment of the invention.

FIG. 2F shows the substrate 200, which is shown in FIG. 2A, including the structure 202 and the film 204, which are shown in FIG. 2A, and caps 220 and 222 and a liner 218 formed on the film 204 in accordance with another embodiment of the invention. The liner 218 shown in FIG. 2D is described above with reference to FIG. 2C.

The caps 220 and 222 are formed at the edges of the structure 202. The caps 220 and 222 are not limited to a particular shape or material. Any shape that is suitable for providing the function, such as protecting devices or blocking the diffusion of atoms, for which the caps are designed is suitable for use in connection with embodiments of the present invention. Exemplary shapes for the caps 220 and 222 include substantially semi-spherical hemispheres, substantially square cubes or substantially rectangular structures. Any material that is suitable for providing the function, such as protecting devices or blocking the diffusion of atoms, for which the caps are designed is suitable for use in connection with embodiments of the present invention. Exemplary materials suitable for use in forming the caps 220 and 222 include silicon nitride, silicon dioxide and carbon.

Figure 2G:
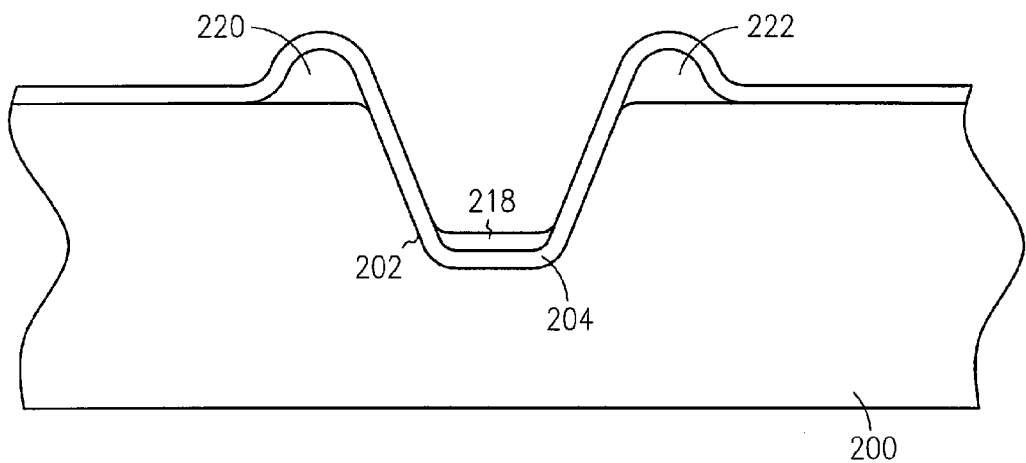
FIG. 2G shows the substrate, which is shown in FIG. 2F, and the structure including the film and the caps and the liner only partially eroded after the plasma heat-up operation in accordance with another embodiment of the invention.

FIG. 2G shows the substrate 200, which is shown in FIG. 2F, and the structure 202 including the film 204 and the caps 220 and 222 and the liner 218 only partially eroded after the plasma heat-up operation in accordance with another embodiment of the invention. The film 204 is substantially unchanged after the plasma heat-up operation. Thus, the liner 218 protects the film 204 from erosion during a plasma heat-up operation.

Further processing of the substrate 200 can include removal of the caps 220 and 222 and the addition of fill material to the structure 202, as shown in FIG. 2E and described above.

CONCLUSION

The above mentioned problems related to integrated circuits and integrated circuit manufacturing problems, as well as other problems, are addressed by the present invention and will be understood by reading and studying the following specification.

In one embodiment, a method includes, prior to a plasma heat-up operation, forming a film on a structure coated with an insulator.

In an alternative embodiment, a method includes, prior to a plasma heat-up operation, forming a thin film insulator on a trench coated with an insulator.

In another alternative embodiment, a method includes, prior to a plasma heat-up operation, forming an oxide on a structure coated with an insulator.

In another alternative embodiment, a method includes, prior to a plasma heat-up operation, forming a liner having a thickness of between about 50 angstroms and about 400 angstroms on a trench coated with an insulator.

In another alternative embodiment, a method includes, prior to a plasma heat-up operation, forming a thin film insulator that partially covers an insulator coating a structure.

In another alternative embodiment, a method includes, prior to a plasma heat-up operation, forming an oxide that completely covers an insulator coating a trench.

In another alternative embodiment, a method includes forming a structure on a substrate, forming an insulator on the structure, and after forming a liner on the insulator, applying a plasma heat-up operation to the substrate.

In another alternative embodiment, a method includes forming a trench on a substrate, forming an nitride on the trench, and after forming a thin film insulator on the nitride, applying a plasma heat-up operation to the substrate.

In another alternative embodiment, a method includes forming a structure on a substrate, forming an oxide on the structure, forming a nitride on the oxide, and after forming an oxide on the nitride, applying a plasma heat-up operation to the substrate.

In another alternative embodiment, a method includes forming a trench on a substrate, forming an insulator on the trench, and after forming a liner having a thickness of between about 50 angstroms and about 400 angstroms on the insulator, applying a plasma heat-up operation to the substrate.

In another alternative embodiment, a method includes forming a structure on a substrate, forming an nitride on the structure, and after forming a thin film insulator partially covering the nitride, applying a plasma heat-up operation to the substrate.

In another alternative embodiment, a method includes forming a trench on a substrate, forming an oxide on the trench, forming a nitride on the oxide, forming an oxide that completely covers the nitride, and after forming a liner on the insulator, applying a plasma heat-up operation to the substrate.

In another alternative embodiment, a method includes forming a structure on a substrate, forming an insulator on the structure, after forming a liner on the insulator, applying a plasma heat-up operation to the substrate, and forming an oxide on the substrate.

In another alternative embodiment, a method includes forming a trench on a substrate, forming an nitride on the trench, after forming a thin film insulator on the nitride, applying a plasma heat-up operation to the substrate, and filling the trench with silicon dioxide.

In another alternative embodiment, a method includes forming a structure on a substrate, forming an oxide on the structure, forming a nitride on the oxide, after forming an oxide on the nitride, applying a plasma heat-up operation to the substrate, and forming an oxide on the substrate.

In another alternative embodiment, a method includes forming a trench on a substrate, forming an insulator on the trench, after forming a liner having a thickness of between about 50 angstroms and about 400 angstroms on the insulator, applying a plasma heat-up operation to the substrate, and filling the trench with silicon dioxide.

In another alternative embodiment, a method includes forming a structure on a substrate, forming an nitride on the structure, after forming a thin film insulator partially covering the nitride, applying a plasma heat-up operation to the substrate, and forming an oxide on the substrate.

In yet another alternative embodiment, a method includes forming a trench on a substrate, forming an oxide on the trench, forming a nitride on the oxide, forming an oxide that completely covers the nitride, after forming a liner on the insulator, applying a plasma heat-up operation to the substrate, and filling the trench with silicon dioxide.

Although specific embodiments have been illustrated and described herein, it will be appreciated by those of skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

Embodiments of the present invention include liners and processes for the fabrication of liners that enable the use of plasma heat-up operations in the manufacture of integrated circuit devices and structures without the failure of integrated circuit devices or structures.

What is claimed is:

1. A method comprising:

forming a structure on a substrate;

forming a liner on the structure;

applying a plasma heat-up operation to the substrate such that portions of the liner are removed leaving a remaining portion of the liner contacting the structure with portions of the structure exposed essentially without eroding the structure; and coating the structure with a dielectric material.

2. The method of claim 1, wherein the structure includes a shape selected from the list consisting of a depression, a coated depression, an elongated trench depression, a built up structure, a coated built up structure, and combinations thereof.

3. The method of claim 1, wherein the substrate comprises at least one material selected from the list consisting of silicon, germanium, silicon germanium alloys, gallium arsenide, silicon-on-sapphire, zinc selenide, and combinations and alloys thereof.

4. The method of claim 1, wherein the structure is a trench.

5. The method of claim 4, wherein coating the structure includes filling the trench.

6. The method of claim 4, wherein the liner is a continuous layer covering substantially the entirety of the trench.

7. The method of claim 4, wherein the trench has a substantially horizontal bottom region, at least two substantially vertical side wall regions and a shoulder region at about the intersection of the side wall and a surface of the substrate; and
wherein the liner covers at least a bottom region of the trench and a shoulder region of trench.

8. A method comprising:
forming a trench on a substrate;
forming a nitride on the trench; and
after forming a continuous thin film insulator on the nitride, applying a plasma heat-up operation to the substrate such that portions of the continuous thin film insulator are removed leaving a remaining portion of the continuous thin film insulator contacting the nitride with portions of the nitride exposed essentially without eroding the nitride.

9. The method of claim 8, wherein the substrate comprises gallium arsenide.

10. The method of claim 8, wherein the substrate comprises silicon-germanium.

11. A method comprising:
forming a structure on a substrate;
forming an oxide on the structure;
forming a nitride on the oxide; and
after forming a continuous oxide on the nitride, applying a plasma heat-up operation to the substrate such that portions of the continuous oxide are removed leaving a remaining portion of the continuous oxide contacting the nitride with portions of the nitride exposed essentially without eroding the nitride.

12. The method of claim 11, wherein the substrate comprises silicon-on-sapphire.

13. The method of claim 11, wherein the substrate comprises zinc selenide.

14. A method comprising:
forming a trench on a substrate;
forming an insulator on the trench; and
after forming a liner having a thickness of between about 50 angstroms and about 400 angstroms on the insulator, applying a plasma heat-up operation to the substrate prior to a plasma deposition such that portions of the liner are removed leaving a remaining portion of the liner contacting the insulator with portions of the insulator exposed essentially without eroding the insulator.

15. The method of claim 14, wherein the substrate comprises silicon.

16. The method of claim 14, wherein the substrate comprises germanium.

17. A method comprising:
forming a structure on a substrate;
forming a nitride on the structure; and
after forming a thin film insulator partially covering the nitride, applying a plasma heat-up operation to the substrate prior to a plasma deposition such that portions of the thin film insulator are removed leaving a remaining portion of the thin film insulator contacting the nitride with portions of the nitride exposed essentially without eroding the nitride.

18. The method of claim 17, wherein the substrate comprises gallium arsenide.

19. The method of claim 17, wherein the substrate comprises silicon-on-sapphire.

20. A method comprising:
forming a trench on a substrate;
forming an oxide on the trench;
forming a nitride on the oxide;
forming an oxide that completely covers the nitride; and
after forming the oxide that completely covers the nitride, applying a plasma heat-up operation to the substrate prior to a plasma deposition nitride such that portions of the oxide are removed leaving a remaining portion of the oxide contacting the nitride with portions of the nitride exposed essentially without eroding the nitride.

21. The method of claim 20, wherein the substrate comprises silicon-on-sapphire.

22. The method of claim 20, wherein the substrate comprises zinc selenide.

23. A method comprising:
forming a trench on a substrate;
forming a nitride on the trench;
after forming a thin film insulator disposed over the trench and the nitride, applying a plasma heat-up operation to the substrate such that portions of the thin film insulator are removed leaving a remaining portion of the thin film insulator contacting the nitride with portions of the nitride exposed essentially without eroding the nitride; and
filling the trench with silicon dioxide.

24. The method of claim 23, wherein the substrate comprises gallium arsenide.

25. The method of claim 23, wherein the substrate comprises silicon-germanium.

26. A method comprising:
forming a trench on a substrate;
forming an insulator on the trench;
after forming a liner having a thickness of between about 50 angstroms and about 400 angstroms on the insulator, applying a plasma heat-up operation to the substrate such that portions of the liner are removed leaving a remaining portion of the liner contacting the insulator with portions of the insulator exposed essentially without eroding the insulator; and
filling the trench with silicon dioxide.

27. The method of claim 26, wherein the substrate comprises silicon.

28. The method of claim 26, wherein the substrate comprises germanium.

29. A method comprising:
forming a structure on a substrate;
forming a nitride on the structure;
after forming a thin film insulator partially covering the nitride, applying a plasma heat-up operation to the substrate such that portions of the thin film insulator are removed leaving a remaining portion of the thin film insulator contacting the nitride with portions of the nitride exposed essentially without eroding the nitride; and forming an oxide on the substrate.

30. The method of claim 29, wherein the substrate comprises gallium arsenide.

31. The method of claim 29, wherein the substrate comprises silicon-on-sapphire.

32. A method comprising:

forming a trench on a substrate;

forming an oxide on the trench;

forming a nitride on the oxide;

forming an oxide that completely covers the nitride;

after forming the oxide that completely covers the nitride, applying a plasma heat-up operation to the substrate such that portions of the oxide are removed leaving a remaining portion of the oxide contacting the nitride with portions of the nitride exposed essentially without eroding the nitride; and filling the trench with silicon dioxide.

33. The method of claim 32, wherein the substrate comprises silicon-on-sapphire.

34. The method of claim 32, wherein the substrate comprises zinc selenide.

35. The method of claim 1, wherein forming a liner includes forming the liner as two or more discontinuous liner elements.

36. The method of claim 1, wherein forming a liner includes forming the liner as three disconnected liner elements.

37. The method of claim 36, wherein forming the liner as three disconnected liner elements forming one of the liner elements on a bottom region of the structure, forming a second one of the liner elements on a first shoulder of the structure, and forming a third one of the liner elements on a second shoulder of the structure, the first shoulder separated from the second shoulder.

* * * * *

UNITED STATES PATENT AND TRADEMARK OFFICE
CERTIFICATE OF CORRECTION

PATENT NO. : 7,632,737 B2
APPLICATION NO. : 11/458064
DATED : December 15, 2009
INVENTOR(S) : Neal R. Rueger et al.

Page 1 of 1

It is certified that error appears in the above-identified patent and that said Letters Patent is hereby corrected as shown below:

On the title page, item (57), under "Abstract", in column 2, line 2, before "structure" insert -- a --.

Signed and Sealed this

Twenty-third Day of March, 2010

David J. Kappos
*Director of the United States Patent and Trademark Office*